United States Patent [19]

Bolton

[11] Patent Number: 5,148,129

[45] Date of Patent: Sep. 15, 1992

[54] MICROWAVE PULSE COMPRESSION FROM A STORAGE CAVITY WITH LASER-INDUCED SWITCHING

[75] Inventor: Paul R. Bolton, Menlo Park, Calif.

[73] Assignee: The United States of America as represented by the United States Department of Energy, Washington, D.C.

[21] Appl. No.: 723,731

[22] Filed: Jun. 20, 1991

Related U.S. Application Data

[63] Continuation of Ser. No. 527,526, May 23, 1990, abandoned.

[51] Int. Cl.$^5$ .......................... H03K 5/01; H01P 1/00
[52] U.S. Cl. ....................................... 333/20; 315/39; 328/65; 333/99 PL
[58] Field of Search ............... 333/13, 20, 262, 99 PL; 328/65; 315/39; 307/106

[56] References Cited

U.S. PATENT DOCUMENTS

| | | | |
|---|---|---|---|
| 3,509,351 | 4/1970 | Stuckert | 333/20 X |
| 4,003,007 | 1/1977 | Stewart | 333/20 |
| 4,176,295 | 11/1979 | Driver et al. | 315/39 |
| 4,227,153 | 10/1980 | Birx | 328/59 |
| 4,255,731 | 3/1981 | Birx | 333/258 |
| 4,329,686 | 5/1982 | Mourou | 342/202 |
| 4,477,746 | 10/1984 | Piltch | 315/39 |
| 4,642,571 | 2/1987 | Minami et al. | 328/59 |
| 4,758,795 | 7/1988 | Ripin et al. | 330/4 |

OTHER PUBLICATIONS

Alvarez et al., "Prepulse Suppression in Microwave Pulse-Compression Cavities", Rev. Sci. Instrum., vol. 57, No. 10, p. 2475, Oct. 1986.
Paul R. Bolton et al., "Operation of a Double Cavity, Microwave Pulse Compression System with Phase Controlled . . . ", IEEE Conference Record/Abstracts '89, Buffalo, N.Y., May 22-24, 1989.
Murray et al., "Gas Triggered Dual Waveguide Cavity Pulse Compression Device", Bulletin of the American Physical Society, vol. 31, No. 9, p. 1616, 1986.
Woodworth et al., "Laser Triggering of a 500-kV Gas-Filled Switch: A Parametric Study", J. Appl. Phys., vol. 56, No. 5, p. 1382, Sep. 1984.

*Primary Examiner*—Paul Gensler
*Attorney, Agent, or Firm*—Miguel A. Valdes; Henry P. Sartorio; William R. Moser

[57] ABSTRACT

A laser-induced switch and a multiple cavity configuration are disclosed for producing high power microwave pulses. The microwave pulses are well controlled in wavelength and timing, with a quick rise time and a variable shape and power of the pulse. In addition, a method of reducing pre-pulse leakage to a low level is disclosed.

Microwave energy is directed coherently to one or more cavities that stores the energy in a single mode, represented as a standing wave pattern. In order to switch the stored microwave energy out of the main cavity and into the branch waveguide, a laser-actuated switch is provided for the cavity. The switch includes a laser, associated optics for delivering the beam into the main cavity, and a switching gas positioned at an antinode in the main cavity. When actuated, the switching gas ionizes, creating a plasma, which becomes reflective to the microwave energy, changing the resonance of the cavity, and as a result the stored microwave energy is abruptly switched out of the cavity. The laser may directly pre-ionize the switching gas, or it may pump an impurity in the switching gas to an energy level which switches when a pre-selected cavity field is attained.

Timing of switching the cavities is controlled by varying the pathlength of the actuating laser beam. For example, the pathlengths may be adjusted to output a single pulse of high power, or a series of quick lower power pulses.

18 Claims, 7 Drawing Sheets

MICROWAVE PULSE COMPRESSION FROM A STORAGE CAVITY WITH LASER-INDUCED SWITCHING

The United Stated Government has rights in this invention pursuant to Contract No. W7405-ENG-48 between the United States Department of Energy and the University of California for the operation of Lawrence Livermore National Laboratory.

This is a continuation of application Ser. No. 07/527,526 filed May 13, 1990, now abandoned.

BACKGROUND OF THE INVENTION

1. Field of the Invention

The present invention relates to high power microwave sources. More specifically, the present invention relates to apparatus for compressing microwave pulses to produce high power pulses of selectable shape and power, including a laser induced switch.

2. Description of Related Art

Microwaves are electromagnetic waves whose frequencies range from approximately 300 megahertz (MHz) to 1000 gigahertz (GHz). The lower end of the microwave region is bounded by radio and television frequencies, and the upper end is bounded by infrared and optical spectrums. Most applications of microwave technology make use of frequencies in the 1 to 40 GHz range, including the bands labeled the L band, S band, C band, X band, $K_u$ band, K band, and $K_a$ band.

Microwave energy has many applications. For example, point-to-point communications and radar advantageously use microwave energy due to its ability to be focused better than lower frequencies. The heating properties of microwave radiation are well known; the microwave oven has become a standard kitchen fixture. Medical applications are possible, for example, the possibility of exposing malignant cells to microwave radiation is being investigated as a method of treating cancer. Other microwave applications include material science. For example, many substances exhibit atomic and molecular resonances when exposed to microwave radiation. The study of these resonances is called microwave spectroscopy, and is of importance in the scientific effort to understand the fundamental nature of solids, liquids, and gases. High-energy particle physics also utilize microwave techniques as, for example in particle accelerator developments.

For military applications, it is sometimes useful to characterize a component by its resistance to directed microwave radiation. To properly characterize a component, it must be tested by high power microwave pulses.

A limitation on the known sources of microwave radiation is the combined lack of power and control. Some sources can produce high power, and others can produce a reliable and controllable pulse. However, some applications require high peak power, (for example 1 gigawatt (Gw)), high repetition rates (>2 pulses per second (pps)), with highly controlled pulse shapes. Also, a quick rise time (a fast pulse) and a short duration is often desirable.

There are many examples of well known sources of microwave radiation, such as klystrons and magnetrons.

Klystrons can produce a microwave pulse that is stable in power, duration, and wavelength at repetition rates up to the KiloHertz level. The duration of the klystron pulse is long, for example 150 nanoseconds, and has a rise time that is long, for example 70 nanoseconds. In the pulsed mode of operation, power may reach a peak of 20 megawatts.

Another source of microwave radiation is the magnetron tube. Magnetrons are a type of cross-field microwave electron tubes wherein electrons, generated from a heated cathode, move under the combined force of a radial electric field and axial magnetic field. Magnetrons have been used since the 1940s as pulsed microwave radiation sources for radar equipment in aircraft as well as ground radar stations. Magnetrons can be used for high power applications where the noise is not a problem. In continuous operation, a magnetron can be suitable for microwave cooking. A typical magnetron system may produce a peak power up to a hundred megawatts, with a low repetition rates. The typical magnetron produces a long pulse with a long rise time.

An exemplary high power relativistic magnetron is capable of providing a noisy 10 gigawatt (GW) pulse for high field, high peak power testing of components and systems. The exemplary microwave pulse has a width of 20–50 nanoseconds, during which unpredictable power spikes may occur. This duration is relatively long, and the risetime is very slow, such as half of the pulse duration. Furthermore, the repetition rate is only one per several hours, and from pulse to pulse, the output frequency may vary unpredictably.

In order to provide high power pulses of short duration, pulse compression methods have been developed to compress a longer, low power pulse into a shorter time, thereby providing higher power. For example, a one microsecond pulse may be compressed to 4 nanoseconds, a decrease of a factor of 250. The peak power of the pulse may increase correspondingly, by a factor of about 100.

Several systems have been developed to compress microwave pulses. In one pulse compression system, microwave energy from a conventional source such as a klystron tube is coupled into a microwave cavity. This cavity comprises a microwave waveguide having a rectangular shape with a lateral branch forming a "T" section. One end of the man cavity has a coupler for coupling n microwave energy, and the other end of the cavity is terminated in a short circuit. Microwave energy is coupled into the main cavity, and initially, the microwave energy coming into the main cavity is stored, and leakage through the lateral branch is low. After the amount of stored microwave energy has increased to the desired level, a switch is actuated, and the microwave energy exits the main cavity through the lateral branch. An explanation of the switching operation is provided in U.S. Pat. No. 4,227,153, issued Oct. 7, 1980 to Birx, which is incorporated by reference herein.

The switch for the microwave cavity may comprise a gas plasma discharge switch, positioned at a distance either a quarter of a guide wavelength ($\lambda g$) from the shorted end of the cavity, or odd multiples of a quarter of a guide wavelength. The switch described in U.S. Pat. No. 4,227,153 includes a discharge tube, which is relatively transparent to microwave energy when it is not actuated. The discharge tube may be filled by neon, for example, and the tube may be actuated by electrodes positioned on either end of the discharge tube. When a voltage is applied across the electrodes, a plasma is formed in the tube, which reflects microwave energy. This reflection effectively changes the character of the main cavity so that the microwave energy is switched out of the main cavity and into the lateral branch within a very short duration.

The U.S. Pat. No. 4,227,153, referenced above, discloses an apparatus that utilizes superconducting elements for generating high power microwave pulses. Specifically, that apparatus includes a superconducting resonator, which is known to maintain very high Qs and therefore it can store a high field strength. The Q value is a measure of the resonator's capacitor for resonance and energy storage at a particular frequency. Because of the high Q, a superconducting resonator can directly store much larger amounts of microwave energy than a resonator made from non-superconducting material, which generally exhibits a much lower Q. The larger amount of energy storage in the superconducting resonator makes it possible to provide a pulse of high power when the discharge switch is actuated.

Another type of switch, similar to the discharge switch, is similarly positioned in the cavity. The spark gap discharge switch comprises a spark gap positioned at the end of the gas tube. When actuated, the spark creates a few free electrons. The microwave energy is coupled to these electrons, and the number of electrons quickly cascades. Within a very short time, a plasma is created in the gas tube, which reflects the microwaves, thereby switching the microwave pulse.

The waveguide with a "T" branch described above can provide a compressed microwave pulse that has a high power, a fast rise time, and a predictable wavelength and pulse shape. However, the repetition rate of the system is limited by the rise time of the electronics necessary to provide the spark. Furthermore, the repetition rate is ultimately limited by the effective recovery rate of the gas discharge tube. Currently the repetition rate is limited to about one pulse per second.

Still another type of switch is described in U.S. Pat. No. 4,255,731, issued Mar. 10, 1981 to Birx, which is incorporated by reference herein. Instead of producing a plasma in an ionizable gas, the switch described in that patent achieves switching by generating an intense beam of electrons in the main waveguide cavity. The intense electron beams are directed transversely to the main waveguide cavity, in a direction parallel to the electric field of the microwave radiation. The patent describes several problems with the gas plasma switch, including its positioning in a region of electrical field intensity which cause losses in the stored energy. Furthermore, rise time is limited by the time needed for the gas of a discharge tube to ionize and produce the appropriate plasma. Furthermore, once the gas is ionized to form a plasma, a certain time for recombination exists during which it is reflective. Until the plasma has adequately decayed, energy storage in the main cavity is limited. The time necessary for effective decay may be termed the recovery time. The repetition rate of the system is ultimately limited by an effective recovery time.

A problem of the gas discharge tube, the spark gap switch, and the intense electron beam switch is their dependence on high voltage electronics. The rise time and the fall time of the electronic systems associated with the switching systems limits the predictability and repetition rates of the output pulses. Typically, the repetition rate may be limited to one pulse per second or less. Furthermore, the output power from a single cavity is limited by the amount of energy that can be stored. Although a substantial amount of microwave energy can be stored in a single cavity, still it is a finite amount, and does not meet many needs of researchers and others in the microwave field. There is a need for a system that can provide microwave pulses having higher power, higher energy, and greater control.

Another problem of the pulse compression systems described above is pre-pulse leakage. Although the amount of leakage is low, still it is a finite amount that is undesirable for some applications. It would be an advantage to have a microwave pulse compression system with lower pre-pulse leakage.

SUMMARY OF THE INVENTION

The present invention provides an apparatus and method for producing high power microwave pulses. The microwave pulses are well controlled in wavelength and timing. They can have a quick rise time from the time of triggering to peak power. Furthermore, the shape of the pulse and the power of the pulse can be varied. In addition, an optional method of reducing pre-pulse leakage to a low level is provided.

The present invention provides a pulse compression system that compresses electromagnetic energy from a conventional microwave source, such as a klystron tube. The microwave energy is directed coherently to one or more microwave cavities that store the microwave energy. Each main cavity has an end that couples microwave energy from the conventional source into the main cavity. At the other end, the main cavity is closed, which reflects microwave energy back into the main cavity. Thus, the main cavity has a high Q resonance, and stores microwave energy in a single mode, represented as a standing wave pattern. In the energy storage state, the standing wave pattern defines nodes and antinodes along the length of the cavity. The main cavity has an output port positioned proximate to a node of the standing wave pattern. The output port connects the main cavity with a branch waveguide. In order to switch the stored microwave energy out of the main cavity and into the branch waveguide, a laser-actuated switch is provided for the main cavity. The switch includes a laser, associated optics for delivering the beam into the main cavity, and a switching gas positioned at an antinode in the main cavity. A switching gas will begin to ionize when it is subjected to a threshold laser irradiation. The beam from the laser is directed to an antinode of the standing wave pattern that has formed in the main cavity in the energy storage state. When the pulsed beam has sufficient fluence, the beam will ionize the switching gas at the antinode, and a plasma will be initiated, which becomes reflective to the microwave energy. This reflection changes the resonance of the cavity Q factor, and as a result the stored microwave energy is abruptly switched out through the port in the main cavity.

As an alternate to the "pre-ionization" switching method described above, a pumping method can be used to switch the stored energy out of the cavity. In this method, an impurity gas in the switching gas is pumped by the laser to excite the impurity atoms (or molecules) to an energy level short of ionization. The energy stored in the cavity "field" ionizes the switching gas to create the plasma. This cavity field-ionization method permits the user to "prescribe" or "program" the cavity field level (therefore the stored energy level) at which the laser-induced plasma switch will become self-activated. In other words, the switching gas is pre-excited, or pumped to a specific energy level by the beam, and then when the field in the main cavity reaches a specific value, the plasma switch will be actuated automatically.

Furthermore, the invention provides an apparatus and method for obtaining very high peak power output pulses using a parallel (two or more) multiple cavity system via cavity field distribution. This is, if a given output power, P is obtained from coherently combining synchronously several individual cavity outputs, then each cavity can operate at reduced field levels and reduced stored energy. In many cases this coherent approach is easier and more stable than using a single high Q cavity to store all of the output pulse energy.

If two or more main microwave cavities are used, then a single laser beam is split by conventional methods, such as a beam splitter. Each separate beam is then delivered along a separate path to a laser-induced plasma switch. Timing of switching of the cavities can be precisely controlled by varying the pathlengths. If, for example, a single pulse of high power is desired with all cavities switching simultaneously, then the pathlengths can be adjusted accordingly. As another example, if a series of quick lower power pulses is desired (pulse train), then the pathlengths will be adjusted to be unequal, and the pathlength difference will determine the separation between the pulses.

In the multiple cavity configuration, a plurality of branch waveguides are provided, each branch waveguide having a port end connected to a respective output port in the main cavity. The other end of the branch waveguide is connected to couplers which connect the branch waveguides together to provide a common output. Each cavity can be times independently and triggered (or dumped) asynchronously if desired.

The multiple cavities have a fixed phase relationship with respect to the energy storage therein. In some embodiments, it is desirable that no phase difference exists at the output. In other embodiments, the phase relationship between the energy stored the cavities may be intentionally varied by a conventional phase shifter at the cavity inputs. If the phase shifter is adjusted to provided a 180° phase shift of the microwave energy in one cavity with respect to the microwave energy in another parallel cavity, then the pre-pulse leakage of one main cavity will cancel the pre-pulse leakage of the other parallel main cavity, this providing a pre-pulse output for the parallel cavity pair of substantially zero. When an output pulse is to be triggered, one of the switches is actuated to release the energy stored in that cavity, and the other cavity is not switched out simultaneously. The result is that pre-pulse leakage can be kept very low.

The present invention efficiently provides an ultra-short, compressed microwave pulse that has high power, a reliable and consistent wavelength, and a broadband spectrum. In the multiple cavity configuration, the output pulse shape can be easily and precisely controlled because the microwaves in the multiple cavities are coherent and triggering is simple and precise. Furthermore, net output gain can be coherently controlled by control of the input phase. Additionally, within a given multiple cavity configuration, different cavities can have different lengths. Also, fi the waveguide length between cavities (on the output side) is greater than the pulse width, the cavities are better isolated.

DETAILED DESCRIPTION OF THE INVENTION

The present invention provides an apparatus and method for producing high power pulses of electromagnetic radiation. The following description first describes the preferred embodiment in general terms, with reference to the figures. Subsequent to the general description, a specific description describes more details of the preferred embodiment, again with reference to the figures. Throughout the description and the figures, like part are designated with like numerals.

General Description

Figures 1, 2:
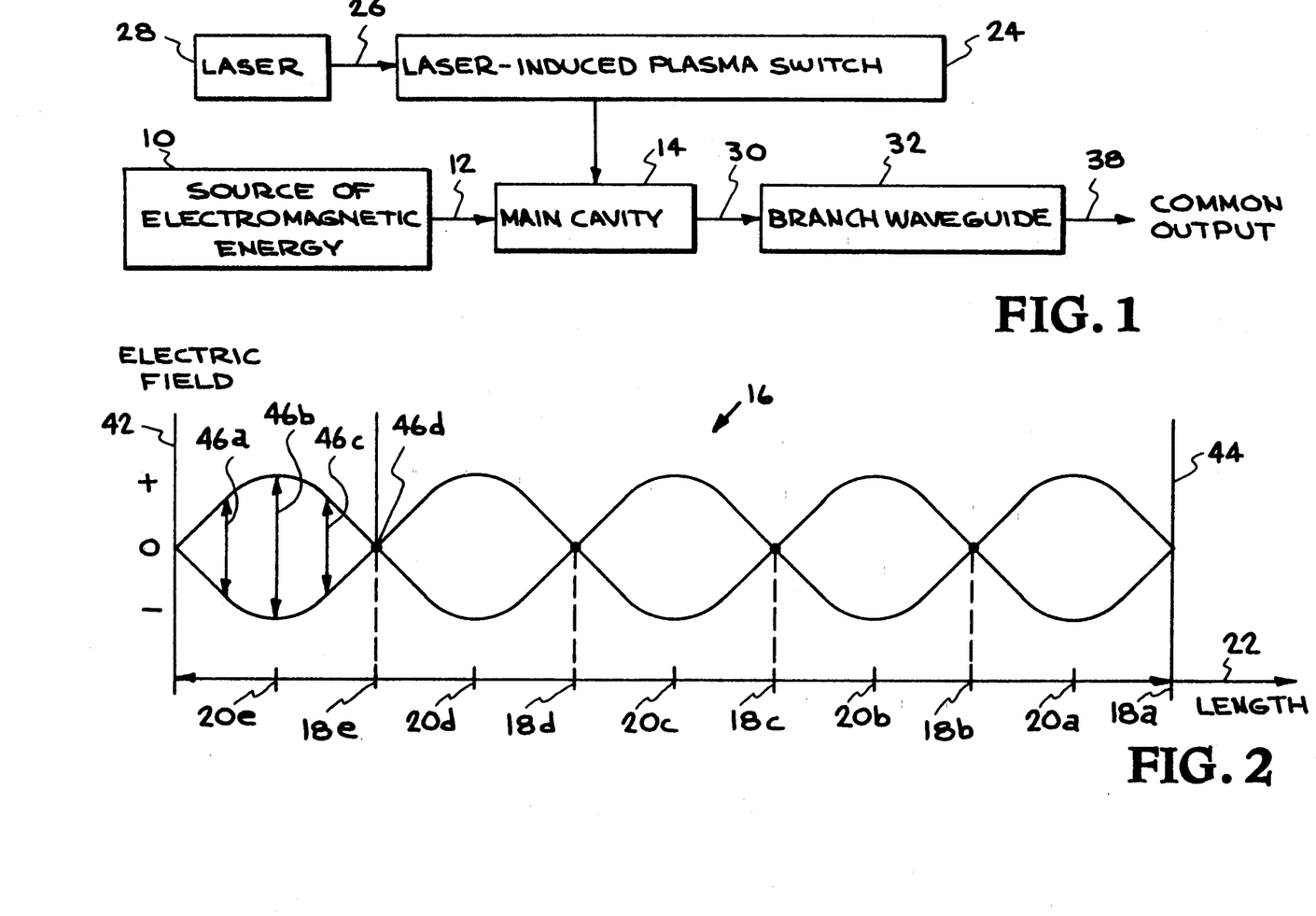
FIG. 1 illustrates an embodiment of the present invention in a block diagram.
FIG. 2 illustrates the stored energy in a resonating microwave cavity.

FIG. 1 illustrates an embodiment of the present invention in a block diagram. An electromagnetic energy source 10 may comprise any of a number of conventional microwave sources, such as a klystron tube that provides microwave energy 12. The microwave energy 12 is coupled into a main cavity 14. The microwave source 10 and the main cavity 14 are tuned to the same frequency, so that the frequency of the microwave energy 12 matches the resonant frequency of the main cavity 14. The main cavity 14 stores the microwave energy 12 in a single resonant mode, illustrated in FIG. 2 as a standing wave pattern 16. Preferably, the main cavity 14 has a high resonance (a high Q), which means that a large amount of microwave energy 12 can be stored in the main cavity 14. The exemplary standing wave pattern 16 defines nodes 18 and antinodes 20 along a length 22 of the main cavity 14.

Microwave pulse compression is achieved by dumping the stored energy of the main cavity 14. Particularly, the microwave energy 12 stored in the standing wave pattern 16 is switched out of the main cavity 14 by a laser-induced plasma switch 24, illustrated in the block diagram of FIG. 1, and also shown in detail in FIG. 3. The beam 26 from a laser 28 is directed to an antinode 20 of the standing wave pattern 16 that is formed in the main cavity 14. When the switch 24 is actuated by application of the beam 26, the microwave energy stored in the main cavity 14 is switched out of the main cavity 14 to provide a microwave pulse 30 of high power and ultra-short duration. Preferably, the output microwave pulse 30 is transmitted to a branch waveguide 32, which comprises a microwave transmission waveguide.

Figure 4:
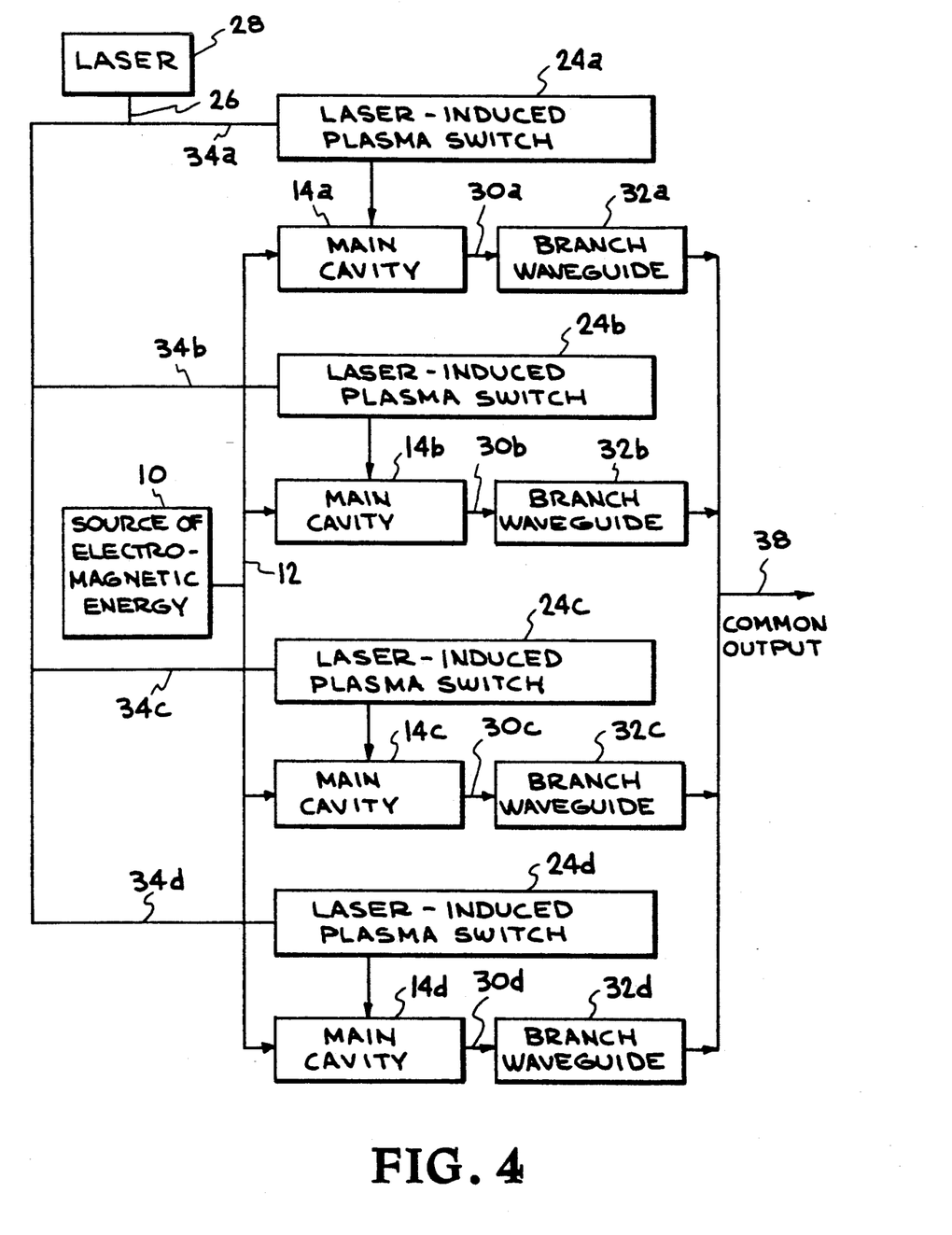
FIG. 4 is a block diagram of an embodiment of the present invention comprising four main cavities, for example.

In a multiple cavity configuration illustrated in FIG. 4, a plurality of main cavities 14a, 14b, 14c, 14d are supplied with microwave energy 12 from the conventional microwave source 10. In the embodiment illustrated in FIG. 4, there are four main cavities 14a, 14b, 14c, 14d, although in other embodiments the number of cavities 14 may be two or more. The laser beam 26 from the laser 28 is split by any conventional device, such as a beamsplitter, into a number of beams 34a, 34b, 34c, 34d corresponding to the number of cavities 14a, 14b, 14c, 14d. Each separate beam 34 is then delivered along a separate path to the respective laser-induced plasma switch 24.

When switched from the main cavities 14, the microwave pulses 30 exiting the cavities 14 ave a high power and ultra-short duration. As illustrated in FIG. 4, a plurality of branch waveguides 32a, 32b, 32c, 32d are provided to transmit the microwave pulses 30. Each branch waveguide 32 is connected to the respective main cavity 14. The other end of each branch waveguide 32 may be coupled together in any conventional manner to provide a common output 38.

The common output 38 is a superposition of the output pulses 30 from the cavities 14, which can be actuated n many different sequences. The precise timing control afforded by the laser switches 24 allows coherent, substantially controllable switching of compressed microwave energy 30 from the microwave cavities 14. The timing of actuating the switches 24 can be precisely controlled by varying the pathlengths of the respective beams 34. In other words, by varying the time at which the laser beam 34 arrives at the respective switch 24, the common output 38 can be varied to output any of a large variety of pulse shapes and peak power levels, including multiple pulses.

Specific Description

Reference is made to the block diagram of FIG. 1. In the preferred embodiment, the electromagnetic energy source 10 provides microwave energy 12 from a klystron tube tuned to a resonant frequency of the main cavity 14. However, any of a number of other conventional sources, such as a magnetron, is acceptable to provide the microwave energy 12.

Figure 5:
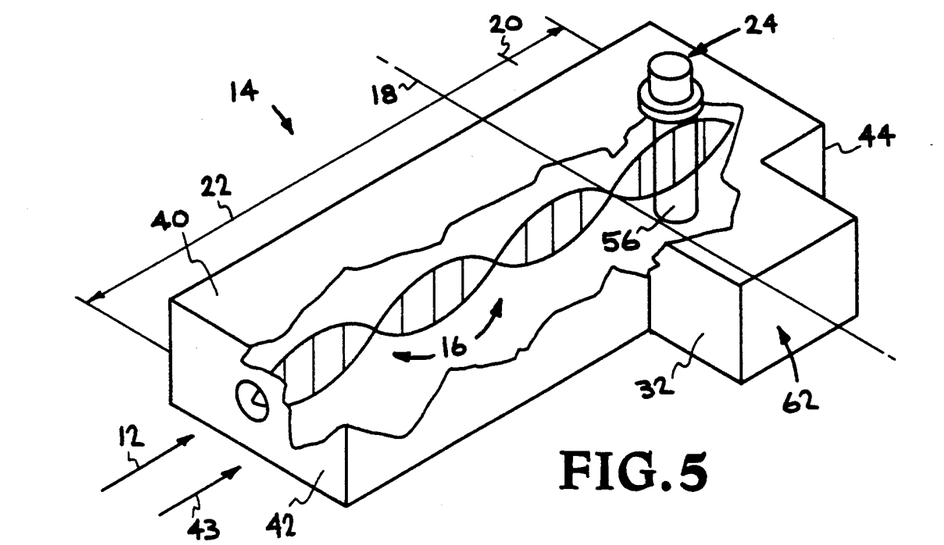
FIG. 5 is a perspective and partial cut-away view of a main cavity with a standing wave in it.

The microwave energy 12 is applied to the main cavity 14, illustrated in FIG. 5, which comprises a stable, single mode cavity. The main cavity 14 comprises a section of a conventional microwave waveguide 40 having the length 22. As in conventional waveguide design of a stable single mode cavity, the dimensions of the waveguide 40 are chosen to substantially transmit the frequency of the microwave energy 12. Furthermore, the length 22 is chosen to match a particular single mode of oscillation of the microwave radiation in the main cavity 14. In FIG. 5, the illustrated embodiment of the waveguide 40 comprises a conventional rectangular cross-section, and the length 22 is chosen to be two and one-half wavelengths, which is a multiple of one-half of the wavelength. In other embodiments (not shown) the waveguide 40 may comprise another cross-sectional configuration, such as circular, and a different length 22. The embodiments of the present invention can be generalized to include different microwave cavity single modes and therefore different cavity shapes. The cavity lengths can also be varied (thereby selecting another mode) as well as the resonant frequency.

The main cavity 14 has an end 42 that couples microwave energy 12 from the microwave source 10 into the main cavity 14. The coupling end 42 is designed in any conventional manner to couple the microwave energy substantially unidirectionally; i.e., the end 42 couples the microwave energy 12 into the main cavity 14 in the direction illustrated by the arrow 43, but does not permit substantial coupling in the reverse direction, out of the main cavity 14 when the cavity 14 is filled. An opposite end 44 of the microwave waveguide 40 is closed, to reflect microwave energy. As a result, the main cavity 14 has a high resonance (i.e., a high Q) at the microwave wavelength for which is it designed. The main cavity 14 may be filled with air. Alternately, the main cavity 14 may be filled with any of a number of conventional gases, in order to increase the amount of energy that can be stored in the main cavity 14. The gas in the cavity 14 is a variable (this includes pressure). For example, the main cavity 14 may be filled with high pressure $SF_6$ in order to sustain high fields in the single mode stored in the main cavity 14.

In operation, the microwave radiation coupled into the main cavity 14 is transmitted by the waveguide 40 to the opposite, closed end 44. At the opposite end 44, the microwave radiation is reflected back into the main cavity 14, which transmits it back to the coupling end 42, which reflects it back to the closed end 44. This process repeats, and the result is a single mode of oscillation, illustrated in FIGS. 2 and 5 as the standing wave pattern 16. The single mode, standing wave pattern 16 represents microwave energy stored in the main cavity 14. As illustrated in FIG. 2, the standing wave pattern 16 has an electric field that varies periodically in time. The electric field also spatially varies along the length 22 of the main cavity 14. The electric field is represented conventionally by the length of the lines 46a, 46b, 46c, 46d. The electric field reaches a maximum at the line 46b, which marks the location of the antinode 20e. The electric field reaches a minimum at the line 46d, which represents the optimum zero electric field and therefore the line 46d is illustrated as a point. The line 46d marks the location of a node 18e. The pattern of maximum and minimum is repeated through the length 22 of the cavity 14, and therefore, the exemplary standing wave pattern 16 defines nodes 18 and antinodes 20 along the length 22. In other embodiments (no shown) a different single mode may produce a wave pattern different from the standing wave pattern 16.

Figure 3:
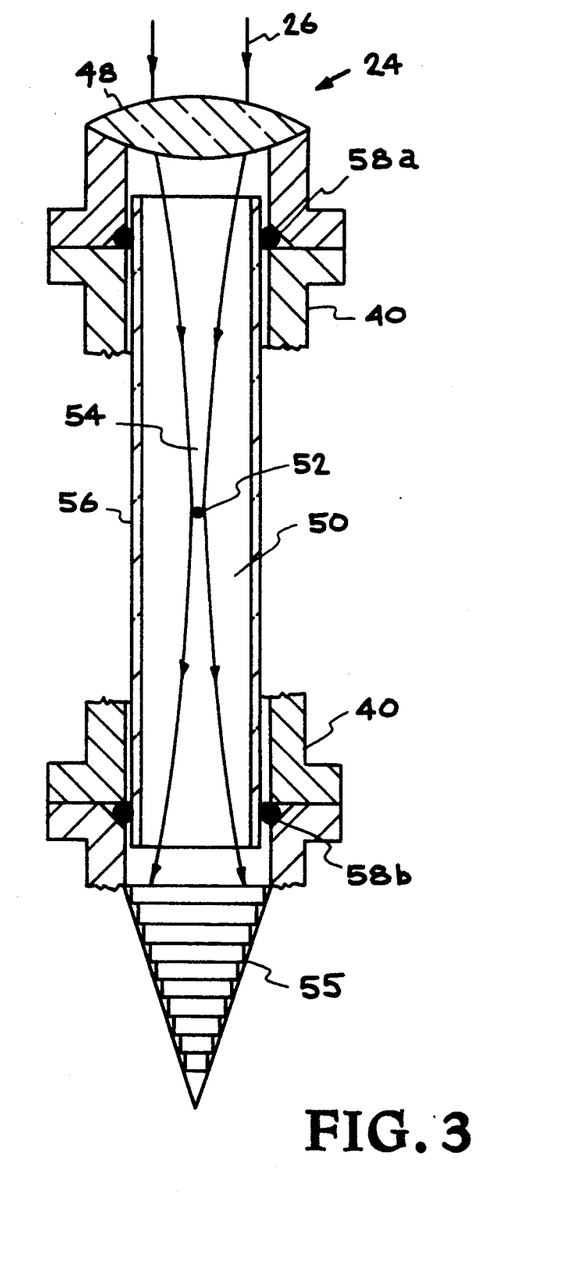
FIG. 3 illustrates a laser-induced plasma switch.

Microwave pulse compression is achieved by dumping the stored energy of the main cavity 14. Particularly, in order to switch the microwave energy stored in the exemplary standing wave pattern 16 out from the main cavity 14, the laser-induced plasma switch 24 is actuated. The laser-induced plasma switch 24 is illustrated in FIG. 3. The switch 24 includes optics, including a lens 48 for delivering the laser beam 26 into the main cavity 14, and also includes an ionizable switching gas 50 that is positioned in the main cavity 14 proximate to any antinode 20. The switch 24 operates by applying laser energy from the beam 26 through the lens 48, which focuses the beam 26 in the switching gas 50, at a focal point 52 that preferably is located as close to an antinode 20 as possible. The lens 48 allows for concentration of the laser beam 26 proximate to an antinode 20, to provide a substantial fluence to an interaction region 54. At the side of the waveguide 40 opposite from the lens 48, a beamdump 55 may be included for attenuating the power of the beam 26. Alternately a convex mirror may be included for refocusing the beam 26 at the focal point 52. Preferably the optical entry port into the gas region is kept small to minimize microwave losses.

Figure 6:
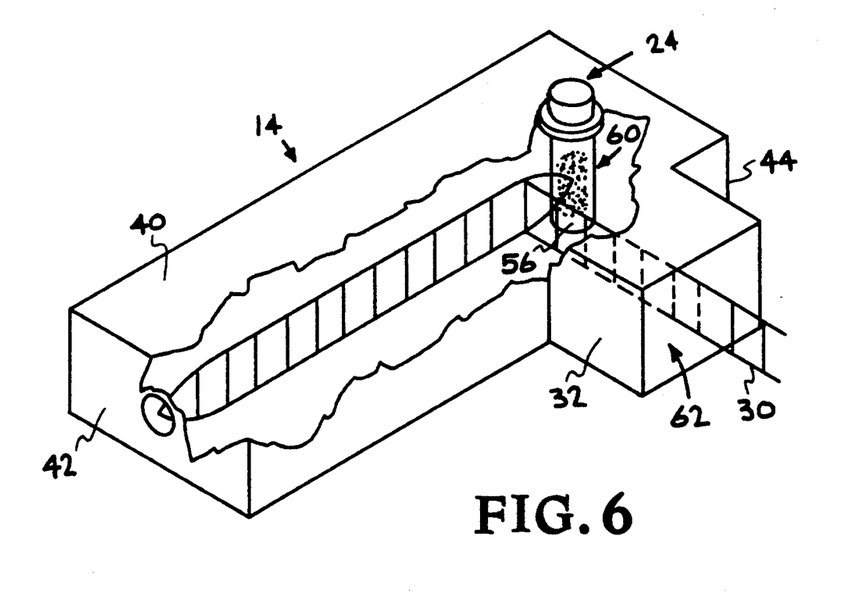
FIG. 6 illustrates the effect of switching the laser-induced plasma switch.

The laser-induced plasma switch 24 operates by applying sufficient laser fluence to the interaction region 54. The fluence ionizes the switching gas 50, freeing electrons from their respective molecules or atoms. It is only necessary to apply a sufficient fluence to locally pre-ionize the switching gas; pre-ionization refers to creation of a threshold level of electrons, a number that can be relatively few. The microwave energy in the standing wave pattern 16 couples to these few electrons, rapidly increasing their number in a cascading process. Alternately, the amount of laser fluence may be increased above a minimum level to produce more electrons at the pre-ionization stage over a larger volume; therefore requiring less microwave energy to be absorbed in the switching process and allowing a higher power output pulse; this procedure may also be effective in switching lower power microwave fields from the cavity 14. This high fluence case may also require less focusing in view of the increased laser pulse energy. When sufficient electrons are freed in the switching gas 50, a plasma 60 is created, illustrated in FIG. 6. A plasma is defined as a collection of ions and free electrons. The plasma 60 which is formed proximate to the antinode 20 is reflective of the microwave energy stored in he standing wave pattern 16. The plasma 60 in effect creates a new boundary end with similar impedance to the closed end 44. Therefore, the reflective plasma 60 changes the resonance characteristic of the main cavity 14, (de-Qs the cavity 14), sharply reducing the microwave energy storage capability at the stored frequency. Also, in other embodiments (not shown) there can be more than one laser-induced plasma switching site within a single cavity 14; i.e., there may be more than one interaction region 54. One site can be activated picoseconds or nanoseconds prior to the other to obtain interesting output pulse variations.

As a result of the much lower Q the microwave energy stored in the main cavity 14 is switched out of the main cavity 14 through a port 62 provided in a side of the waveguide 40. The previously stored microwave energy exits the main cavity 14 in microwave pulse 30 of high power and ultra-short duration. Preferably, the port 62 is centered proximate to a node 18 for efficient energy extraction from the main cavity 14. The switching process takes only a few cycles from the time of application of sufficient laser fluence until the output pulse 30 is switched out of the main cavity 14. The output pulse 30 duration is near the transit time of microwave energy across the cavity 14; and therefore, the cavity length 22 affects the duration of the output pulse 30. The port 62 may be connected to the branch waveguide 32, which comprises a microwave transmission waveguide, so that the output microwave pulse 30 is transmitted out through the ranch waveguide 32. In the embodiment illustrated in FIGS. 5 and 6, the branch waveguide 32 comprises a conventional rectangular cross-section. The main cavities 14 will be better isolated from each other if the length of the branch waveguides 32 between the main cavities 14 is greater than the width of the output pulse 30, to prevent coupling between the cavities 14 during an output pulse 30.

As illustrated in FIG. 3, the switching gas 50 may be disposed in a container 56 positioned in the main cavity 14. The container 56 is substantially transparent to the microwave radiation in the cavity 14. The container 56 may comprise a quartz tube, for example. O-rings 58a, 58b seal the interior of remainder of the main cavity 14 from the outside. The container 56 isolates the switching gas 50 from the gas that resides in the main cavity 14, therefore allowing the switching gas 50 to be a different gas or pressure from that in the main cavity 14. For example, the switching gas 50 may comprise $SF_6$ or neon at atmospheric pressure, and the gas in the main cavity 14 may comprise $SF_6$ at five atmospheres. However, in other embodiments, the container 56 may be omitted if the gas in the main cavity 14 is ionizable and at an acceptable pressure. For example, the switching gas 50 and the gas in the main cavity 14 may both comprise $SF_6$ at five atmospheres pressure, and the container 56 could be omitted. An advantage of this approach is that microwave losses from the container 56 are eliminated and the location of the plasma switch 24 can be adjusted.

The laser-induced plasma switch 24 may be generalized. The laser pulse 26 can cover a range of wavelengths, repetition rates, pulse widths, and pulse energies and the focusing characteristics of the beam 26 and the lens 48 may vary. Also, the switching gas 50 can be varied in species and pressure, and flow rates across the tube 56 can be varied as well as admixture proportions. For example, the use of $SF_6$ as the switching gas 50 can avoid the need for the enclosing quartz tube 56 inside the cavity 14 if the cavity gas is also $SF_6$ at the same pressure. In general, the use of the cavity gas for plasma switching affords control on the maximum cavity field which can be withstood prior to laser irradiation to activate the switch 24. This field hold-off capability is high for high pressures.

As an alternate to the "pre-ionization" switching method described above, a pumping method can be used to switch the stored energy out of the cavity 14. In this method, the switching gas 50 comprises a main gas and an impurity gas that is easily ionizable by a microwave field. For example, the main gas may comprise $SF_6$ and the impurity gas may comprise an alkali such as rubidium or sodium. Impurity levels of the alkali atoms in the switching gas 50 may comprise only a few parts-per-million. The laser beam 26, focused in the interaction region 54, "pumps" or excites the impurity atoms (or molecules) to an energy level short of ionization. The energy stored in the cavity 14 then uses this energy to "field" ionize the switching gas 50 to create the plasma 60. This cavity field-ionization method permits the user to "prescribe" or "program" the cavity field level (therefore the stored energy level) at which the gaseous plasma switch 24 will become self-activated. On other words, the switching gas is pre-excited, or pumped to a specific energy level by the beam 26, and then when the field in the cavity 14 reaches a specific value, the switch 24 will be actuated. The laser beam 26 need not be pulsed; it may operate in continuous waveform (cw). For this purpose, the laser 28 may comprise a tunable cw or pulse laser 28 for pre-excitation of the impurity gas.

Figure 7A:
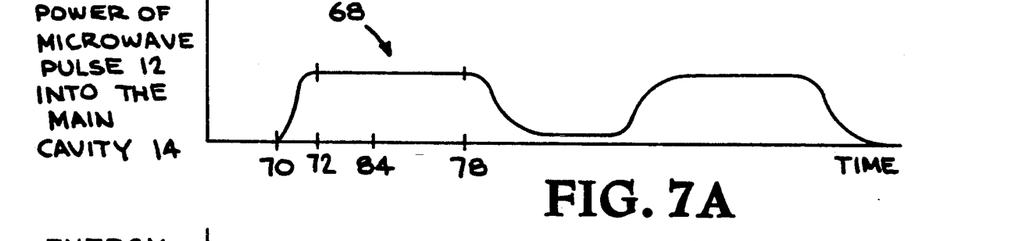
FIGS. 7A, 7B, and 7C are graphical depictions illustration the filling and dumping of a microwave cavity.
Figure 7B:
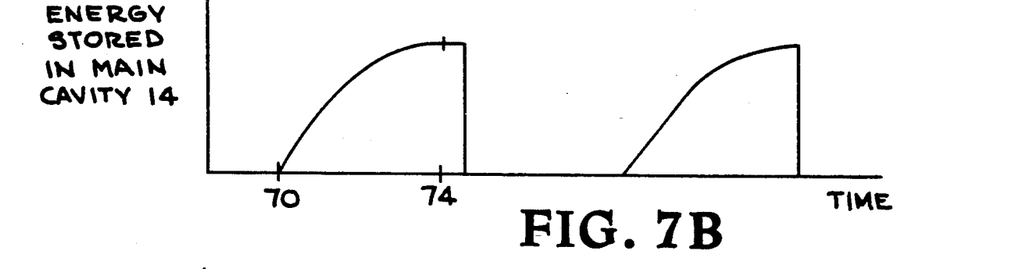
Figure 7C:
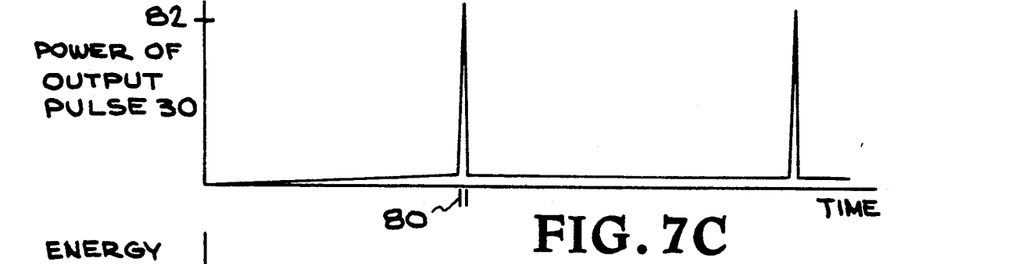

The process of filling the main cavity 14, actuating the laser-induced plasma switch 24, and switching the output pulse 30 is illustrated in FIGS. 7A, 7B, 7C. The input power of a typical microwave pulse 68 from a klystron is illustrated in FIG. 7A. At a time 70, the microwave pulse 68 has measurable power, which begins to rise, and continues to rise until it reaches a plateau at approximately a time 72. This input power is applied to fill the main cavity 14. As illustrated in FIG.

7B, the amount of microwave energy stored in the main cavity 14 begins to rise a the time 70. The amount of stored energy increases quickly at first, and continues to increase but at a decreasing rate until eventually the amount of stored energy levels off at approximately a time 74, even through more energy is continually applied by the source 10. At the time 74, the main cavity 14 is considered to be filled. The decreasing rate and the eventual plateau may be attributed to losses in the main cavity 14 that increase with the amount of stored energy. At the plateau at the time 74, the system has reached a steady state, at which the power input from the source 10 equals the power lost from the main cavity 14. The laser-actuated plasma switch 24 is actuated at approximately a time 78. Within a very short time, such as several nanoseconds, the energy stored in the cavity 14 decreases to almost zero, and as illustrated in FIG. 7C the output pulse 30 exhibits a pulse of ultra-short duration 80 and high power 82.

Even though the input pulse 68 still has measurable power, the main cavity 14 does not immediately begin to fill with microwave energy, because the plasma 60 that was formed when the switch 24 was actuated for the previous pulse has a finite lifetime causing large losses in the main cavity 14 and reduced field hold-off capability. After the plasma 60 has been recombined, the resonance of the cavity (the Q value) is restored and the main cavity 14 is suitable for storing microwave energy. The amount of time for substantial recombination of the plasma 60 may be termed the recovery time. The process of filling with the input pulse 68, storage in the main cavity 14, and switching out can be repeated efficiently after a suitable recovery time has passed. The determination of a suitable recovery time may take into account frequency and field level.

Figure 7D:
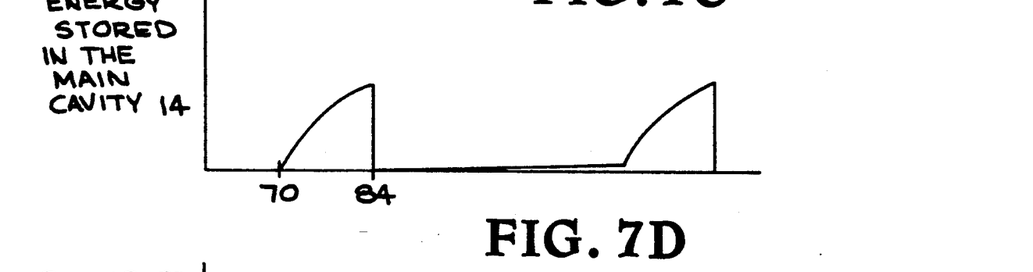
FIGS. 7D, 7E illustrate the effect of switch actuation before the microwave cavity is completely filled with microwave energy.
Figure 7E:
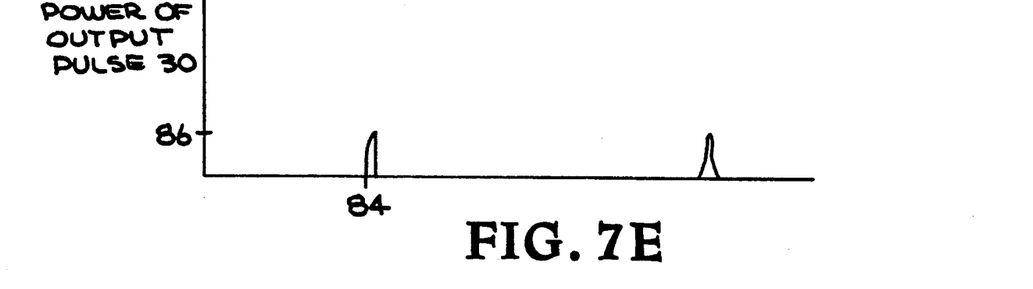

FIGS. 7D, 7E illustrate the effect of actuating the switch 24 before the main cavity 14 is completely filled with microwave energy from the microwave pulse 68. The energy stored in the main cavity 14 begins to rise at the time 70, coincident with the microwave pulse 68. At a time 84, the switch 24 is actuated before the time 74, at which the cavity 14 would have been filed. If the file level in the cavity 14 or the laser pulse energy is high enough at the time 84, the stored energy is switched out of the cavity 14, in a pulse of short duration, with power 86. When FIG. 7E is compared with FIG. 7C, it is seen that the power 82 is substantially less than the power 86. Furthermore, by comparing FIG. 7D with FIG. 7A, it is seen that the microwave energy 12 remaining in the pulse 68 after the time 84 is not efficiently used.

To produce high power pulses 30 in the preferred embodiment, the switch 24 is actuated just subsequent to the time 74, when the cavity 14 is filled to its storage capacity with the microwave energy 12. The storage capacity of a the main cavity 14 is partially determined by its Q value. A higher Q means a higher storage capacity, and a lower Q means a lower storage capacity. To produce high power pulses 30 in the preferred embodiment, the main cavity 14 should have a high Q value, for example 10,000. The main cavity 14 may even comprise superconducting elements such as those described in U.S. Pat. No. 4,227,153, which has been incorporated by reference herein. For efficiency in the preferred embodiment, the pulse 68 is provided with a duration long enough to fill the cavity 14 and short enough that little energy is wasted after actuation of the switch 24.

Figure 8:
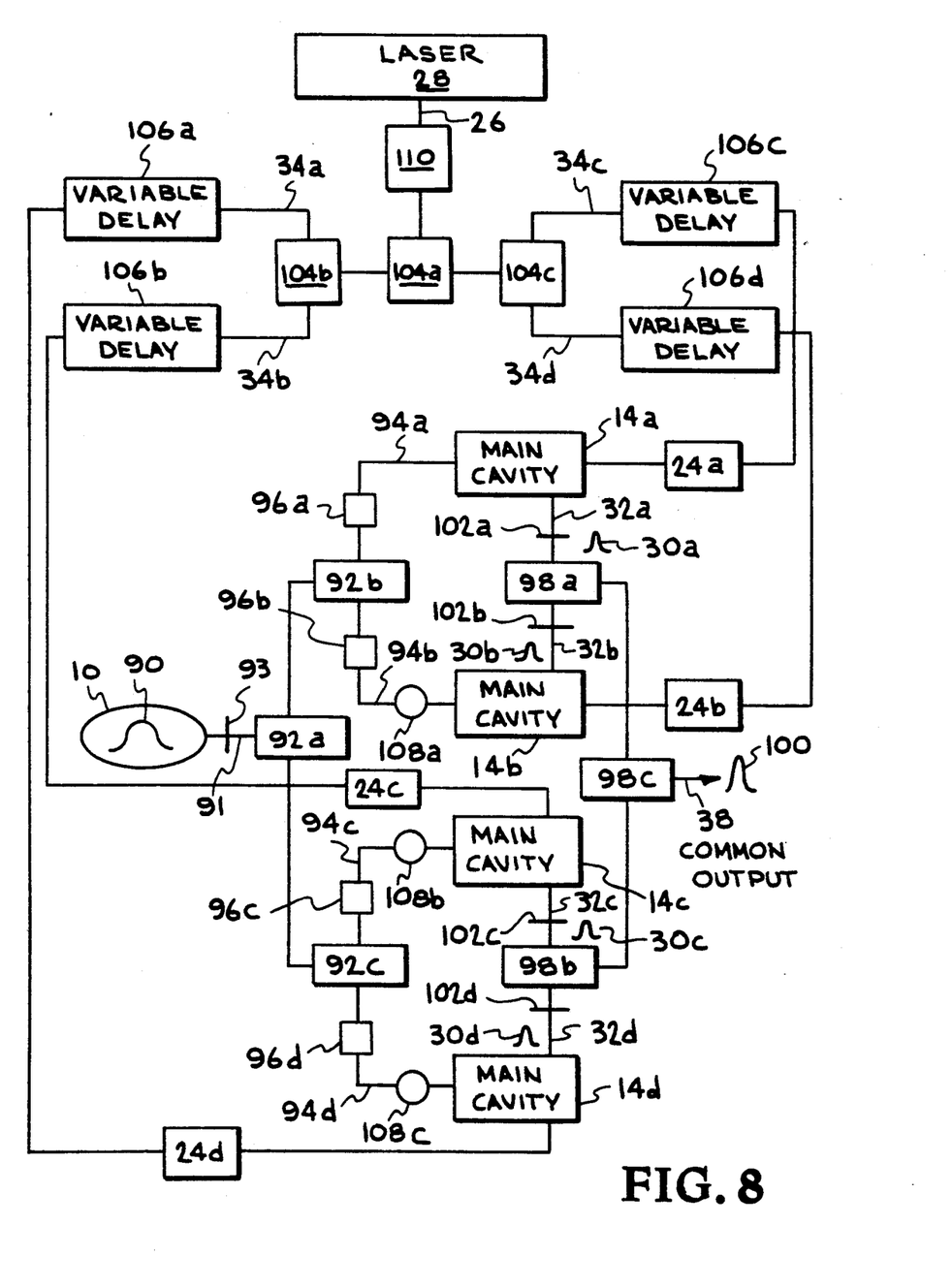
FIG. 8 is a schematic diagram of an embodiment of the present invention comprising four main cavities.

FIG. 8 is a schematic diagram of a preferred embodiment of the present invention, comprising the four main cavities 14a, 14b, 14c, 14d, as in FIG. 4. In other multiple cavity embodiments, the number of main cavities 14 may be two or more. In some embodiments of a multiple cavity configuration, different main cavities 14 can have different lengths. In the multiple cavity configuration of FIG. 8, the plurality of main cavities 14a, 14b, 14c, 14d are supplied with microwave energy 12 from the conventional microwave source 10, which may for example comprise a klystron tube. The microwave energy 12 is represented in FIG. 8 by a long microwave pulse 90.

The pulse 90 is transmitted by a conventional waveguide 91 to a conventional microwave splitter 92a, where it is split into two coherent pulses of approximately equal power and duration. Depending on the field level, it may be desired to maintain a high pressure of a gas, such as $SF_6$, in the conventional waveguide 91. The high pressure may exceed the klystron's operating range. Therefore, a conventional pressure window 93 may be disposed in the waveguide 91 to separate the pressure at the klystron tube 10 from the pressure in the waveguide 91 and the remainder of the system to be described. The pressure window 93 is substantially transparent to the microwave pulse 90.

The two coherent pulses that are output from the splitter 92a are provided respectively to the additional conventional splitters 92b, 92c, which further divide them so that four pulses are provided of approximately equal power and duration. The splitters 92 may comprise any standard 3 dB splitter. These four pulses are provided respectively to the main cavities 14a, 14b, 14c, 14d. Each waveguide 94 is preferably connected to a conventional H-plane tuner 96, which can be tuned so that the impedance of the waveguide 94 is approximately equal to the impedance of the main cavity 14. The proper tuning of the H-plane tuner is observed when there is a minimum reflection from the main cavity 14.

In the embodiment illustrated in FIG. 8, there are four main cavities 14, although in other embodiments the number of cavities 14 may be two or more. As illustrated in FIG. 8, the plurality of branch waveguides 32a, 32b, 32c, 32d are provided to transmit the compressed microwave pulses 30a, 30b, 30c, 30d directly from the main cavities 14a, 14b, 14c, 14d. Specifically, each branch waveguide 32 is connected on one end to its respective main cavity 14. The other end of each branch waveguide 32 is connected to a series of conventional couplers 98a, 98b, 98c which couple the branch waveguides 32 together to provide a common output 38, represented as a microwave pulse 100, which can be a superposition of the output pulses 30. The branch waveguides 32 may comprise a conventional pressure window 102 to separate the pressure in the main system from the pressure at the common output 38. As a result, a higher gas pressure may be maintained in the portion of the microwave system between the window 91 and the windows 102. The gas pressure may be supplied and maintained by any suitable source connected in any conventional manner.

The laser beam 26 from the laser 28 is split by any conventional device, such as a beam splitter 104, into a number of beams 34 corresponding to the number of cavities 14. In the illustrated embodiment, the beam 26 is applied to a beamsplitter 104a, which splits the beam into two separately propagating beams. Each of these beams is then provided to another beamsplitter 104b, 104c, respectively, which output the separate beams 34a, 34b, 34c, 34d. Each separate beam 34 is then delivered along a separate path to the respective laser-induced plasma switch 24a, 24b, 24c, 24d. It is preferable that the pathlengths of the beams 34a, 34b, 34b, 34d be adjusted initially so that they are approximately equal. In other words, it is preferable to initially adjust the pathlengths of the beams 34a, 34b, 34c, 34d, so that if a pulse is propagated from the laser 28, it will be divided and arrive at each switch 24a, 24b, 24c, 24d to switch each main cavity 14a, 24b, 24c, 24d to switch each main cavity 14a, 14b, 14c, 14d substantially simultaneously. A variable delay 106a, 106b, 106c, 106d is provided, respectively in the pathlength of each beam 34a, 34b, 34c, 34d to allow adjustment of the pathlength of each beam 34. Each of the variable delays 106a, 106b, 106c, 106d may comprise any of a number of conventional optical techniques, such as a mirror whose position can be varied to change the pathlength. After the initial adjustment, each of the variable delays 106a, 106b, 106c, 106d can be individually adjusted to provide the desired shape of the common output 38.

The precise timing control afforded by the laser-induced switches 24a, 24b, 24c, 24d allows coherent, substantially controllable switching of compressed microwave energy 30 from the microwave cavities 14, to output any of a large variety of pulse shapes and peak power levels. The common output 38 is a superposition of the output pulses 30 that are dumped from the cavities 14 by the sequence of actuating the switches 24. Timing of switching of the cavities 14 can be precisely controlled by varying the pathlengths, thus varying the time at which the laser beam 34 arrives at the respective switch 24. As a result, the output pulses 30 can be actuated in many different sequences. A single optical switch, such as a conventional switch 110 in the beam 26, may be provided to switch the laser beams 34 to the cavities 14. Also a particular cavity 14 need not have its switch 24 actuated if, for example a lower power common output 38 is desired, or as another example, if pre-pulse suppression enhancement is desired.

Figure 9A:
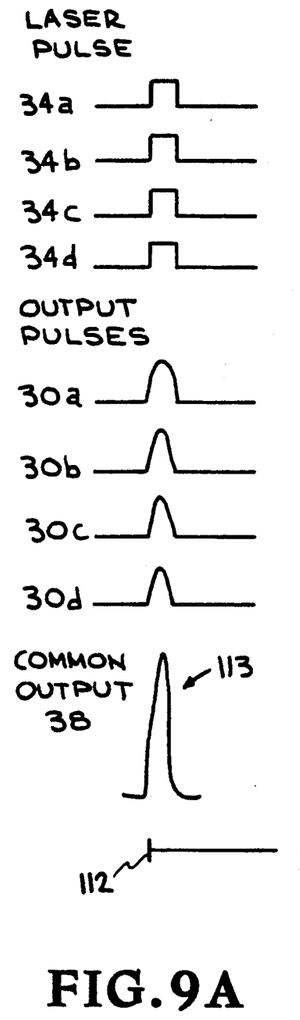
FIGS. 9A, 9B, and 9C are graphical depictions of examples of different sequences of actuating the laser-induced plasma switches.
Figure 9B:
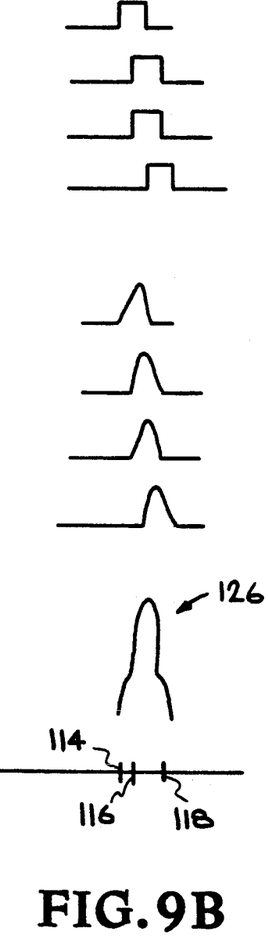
Figure 9C:
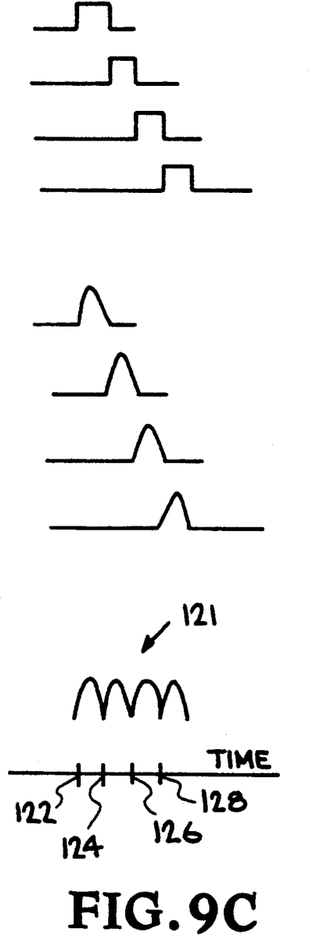

FIGS. 9A, 9B, 9C illustrate several examples of different sequences for timing the switches 24 and their respective common outputs 38. If, for example, a single pulse of high power is desired with all cavities switching simultaneously at a time 112 as illustrated in FIG. 9A, then the pathlengths of the beams 34 will be adjusted to be equal so that small mismatches in output timing can be minimized or eliminated. As a result, the output pulses 30a, 30b, 30c, 30d are dumped simultaneously, and they will be superposed to provide a single compressed high energy pulse 113 at the common output 38. Alternately, the cavities 14 may be switched in a selected sequence. The pathlengths of the beams 34a, 34b, 34c, 34d can be adjusted to be unequal, and the pathlength difference will determine the time separation between the output pulses 30a, 30b, 30c, 30d, therefore determining the selected sequence. FIG. 9B illustrates an example wherein on cavity 14a is switched at a time 114, two cavities 14b, 14c are switched at a time 116, and another cavity 14d is switched at a time 118. The output pulses 30a, 30b, 30c, 30d do not occur simultaneously, and the result is an output pulse 120 that is wider and of less power than the output pulse 113 in FIG. 9A. As a further example illustrated in FIG. 9C, a series of quick low power pulses 121 is provided by switching the cavities 14a, 14b, 14c, 14d, in sequence at the times 122, 124, 126, 128. The result is a multiple pulse train.

With coherent operation, the phase difference of the common output 38 is affected by the phase difference of the standing wave pattern 16 (FIG. 2) between the cavities 14. For maximum power and pulse control at the common output 38, no phase difference should exist between the outputs 30a 30b, 30c, 30d of the cavities 14a, 14b, 14c, 14d. If there is no phase difference, the common output 38 will be a superposition of the pulses 30. Phase control of the cavities 14 and thus the outputs 30 may be obtained by equalizing the distance travelled by the microwave pulse 90 from the source 10 to each cavity 14a, 14b, 14c, 14d. FIG. 8 illustrates conventional phase shifters 108a, 108b, 108c connected respectively to the waveguides 94b, 94c, 94d. The phase shifters 108 may, for example, comprise a mirror for adjusting the pathlength from the source 10 to the cavities 14. The phase shifters 108a, 108b, 108c may be adjusted so that the waveform of the standing wave pattern 16 in each cavity 14 is coherent, and in phase. For example, given the individual outputs 30 from the cavities 14, coherent superposition in phase is accomplished by adjusting the input phase shifters 108 so that the output 38 is coherent.

In some embodiments, the phase relationship between the cavities 14a, 14b, 14c, 14d may be intentionally varied. The phase shifters 108a, 108c can be utilized to provide a common output 38 with very low pre-pulse leakage before switching. For example, if the common output 38 is first adjusted to be in phase, and subsequently the phase shifters 108a, 108c are re-adjusted to give a 180° phase shift, then the pre-pulse leakage of the main cavity 14b will cancer the pre-pulse leakage of the main cavity 14a, and likewise the pre-pulse leakage of the main cavity 14d will cancel the pre-pulse leakage of the main cavity 14c, thus providing a common output 38 of substantially zero. The switches 24a, 24c (FIG. 4) may be actuated to release the energy stored in those two respective cavities 14a, 14c, and the other two cavities 14b, 14d are not switched out simultaneously. The result is that pre-pulse leakage has been kept very low, and a pulse at the common output 38 dumps the energy stored in two of the four cavities 14a, 14b, 14c, 14d.

The present invention efficiently provides an ultra-short, compressed microwave output pulse 38 that has high power, a reliable and consistent wavelength, and a broadband spectrum. In the multiple cavity configuration such as that illustrated in FIG. 4, the pulse shape of the common output 38 can be easily and precisely controlled because the microwaves int h multiple main cavities 14 are coherent and timing of the switches 24 is simple and precise. Furthermore, net output gain can be coherently controlled by varying the input phase with the phase shifters 108 illustrated in FIG. 8.

There are many conventional physical diagnostics that can be used in the laser triggered multiple cavity system to monitor the system, or for feedback controls. An example is a bidirectional coupler which can be used to monitor the reflected microwave pulse energy from any cavity which can monitored for use as a cavity tune monitor or control. Another example is the laser pulse delay path which can be automatically adjusted by, for example, a conventional mechanical device connected to a control system programmed to maintain or output a certain output pulse 38 shape or timing.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the means and range of equivalency of the claims are to be embraced within their scope.

I claim:

1. A pulse compression system that compresses electromagnetic energy from a microwave source, comprising:
   a microwave cavity including a main cavity coupled to the microwave source, said microwave cavity having a configuration suitable for storing microwave energy in the main cavity in substantially a single mode, said main cavity defining nodes and antinodes of the single mode; and,
   a switch, including means for applying laser energy in the main cavity proximate to an antinode of the single mode, said switch comprising a switching gas positioned so that the laser energy interacts with the switching gas proximate to an antinode of the standing wave pattern, said switching gas comprising a main gas and an impurity gas wherein the impurity gas is suitable for pumping to an excited bu non-ionized energy level by the laser energy so that the switching gas is ionized by the microwave energy in the cavity when the microwave energy reaches a predetermined level to switch the microwave energy out of the main cavity.

2. The pulse compression system as claimed in claim 1, wherein a second gas fills the main cavity, and wherein said pulse compression system further comprises a container positioned in the main cavity so that it isolates the switching gas from the second gas.

3. A method of compressing a microwave pulse, comprising the steps of:
   (a) providing a source of microwaves;
   (b) applying microwave radiation from the microwave source to a plurality of main cavities, wherein the microwave radiation is stored as a single mode, said microwave radiation being applied to the plurality of main cavities in a coherent manner so that a fixed phase relationship exists between the cavities;
   (c) applying laser radiation from a single laser in at lest two of the main cavities proximate to an antinode of the single mode pattern formed therein, so that a plasma is formed in a switching gas that is reflective of the microwaves to switch the microwaves out of the main cavities;
   (c) coherently combining the output of the switched main cavities to provide a common output; and
   (e) controlling the timing of the application of laser radiation to each main cavity to control the common output.

4. The method of compressing a microwave pulse as claimed in claim 3, wherein in the step (c), the laser radiation pumps an impurity gas to an energy level where it can be used by the microwaves to ionize the switching gas.

5. The method of compressing a microwave pulse as claimed in claim 3, wherein in step (c), the laser energy is applied in a selected sequence to the plurality of main cavities.

6. The method of compressing a microwave pulse as claimed in claim 3, wherein the microwave cavities comprise a pair including a first microwave cavity and a second microwave cavity whose output is coupled together and provided to the common output, and in the step (b), the phase relationship of the first microwave cavity with respect to the second microwave cavity is adjusted so that the first cavity has a phase relationship that is approximately 180° with respect to the second cavity, so that the power pre-pulse leakage from the output is reduced.

7. A pulse compression system that compresses electromagnetic energy from a microwave source, comprising:
   a plurality of microwave cavities arranged in parallel, each comprising:
      a main cavity which stores microwave energy in a single mode having a standing wave pattern of nodes and antinodes;
      an output port in the main cavity positioned proximate to a node of the standing wave pattern;
      a branch waveguide connected to the output port of the main cavity;
   microwave pulse splitting means for splitting a single microwave pulse from the microwave source into a plurality of microwave input pulses;
   microwave input pulse coupling means for coupling each microwave input pulse into an associated main cavity;
   a laser;
   a plurality of laser-induced gaseous switches, each container a switching gas, on positioned in each main cavity at an antinode of the standing wave pattern;
   laser pulse splitting means for splitting a single laser pulse from the laser into a plurality of laser switching pulses;
   laser switching pulse coupling means for coupling each laser switching pulse into an associated laser induced gaseous switch wherein the switching gas is ionized to produce a plasma which is reflective to the microwave energy in the main cavity to switch the microwave energy out of the main cavity through the output port into the branch waveguide;
   switching timing control means for varying the timing of each laser switching pulse to its associated laser-induced gaseous switch;
   output combining means for combining the outputs from each branch waveguide.

8. The pulse compression system of claim 7 further comprising input phase control means operatively connected to the microwave input coupling means to vary the phase of the standing wave patterns between different main cavities.

9. The pulse compression system of claim 7 wherein the switch timing control means comprises variable delay means.

10. The pulse compression system of claim 9 wherein the variable delay means comprise pathlength adjustment means operatively associated with the laser switch pulse coupling means.

11. The pulse compression system of claim 7 wherein the switch timing control means provide simultaneous laser switching pulses to all laser-induced gaseous switches.

12. The pulse compression system of claim 7 wherein the switch timing control means provide sequential laser switching pulses to all laser-induced gaseous switches.

13. The pulse compression system of claim 8 wherein the standing wave patterns in a pair of main cavities are 180° out of phase.

14. The pulse compression system of claim 12 wherein the sequential pulses overlap to provide a single output pulse of controllable shape determined by the amount of overlap.

15. The pulse compression system of claim 12 wherein the sequential pulses do not overlap to produce a sequence of separate output pulses.

16. The pulse compression system of claim 7 wherein the switching gas fills the entire main cavity.

17. The pulse compression system of claim 7 further comprising a microwave transparent container positioned in each main cavity wit the switching gas contained therein.

18. The pulse compression system of claim 7 wherein the switching gas comprises a main gas and an impurity gas, wherein the laser switching pulse excites the impurity gas to an energy level short of ionization and the microwave energy ionizes the switching gas to produce a plasma.

* * * * *